(12) United States Patent
Mangtani

(10) Patent No.: US 6,272,015 B1
(45) Date of Patent: Aug. 7, 2001

(54) POWER SEMICONDUCTOR MODULE WITH INSULATION SHELL SUPPORT FOR PLURAL SEPARATE SUBSTRATES

(75) Inventor: Vijay Mangtani, San Jose, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/632,026

(22) Filed: Aug. 2, 2000

Related U.S. Application Data

(62) Division of application No. 09/197,078, filed on Nov. 20, 1998, now Pat. No. 6,147,869.
(60) Provisional application No. 60/146,678, filed on Aug. 2, 1999, provisional application No. 60/146,891, filed on Aug. 2, 1999, and provisional application No. 60/066,452, filed on Nov. 24, 1997.

(51) Int. Cl.[7] ................................................. H05K 7/20
(52) U.S. Cl. .................... 361/707; 361/704; 361/719; 361/713; 361/752; 174/52.2; 174/52.3; 165/803; 165/185; 257/706; 257/717
(58) Field of Search ......................... 361/704, 707, 361/715, 717–719, 723, 736, 752, 761, 796; 174/52.2, 52.4, 52.3; 257/687, 706, 707, 713, 787, 796; 165/80.3, 185

(56) References Cited

U.S. PATENT DOCUMENTS

| | | | |
|---|---|---|---|
| 4,899,256 | * | 2/1990 | Sway-Tin ............................ 361/715 |
| 4,965,710 | * | 10/1990 | Pelly et al. .......................... 363/56 |
| 5,031,069 | * | 7/1991 | Anderson ........................ 361/321.1 |
| 5,373,418 | * | 12/1994 | Hayasi .............................. 361/707 |
| 5,398,160 | * | 3/1995 | Umeda .............................. 361/707 |
| 5,521,437 | * | 5/1996 | Oshima et al. .................... 257/701 |
| 5,536,972 | * | 7/1996 | Kato .................................. 257/706 |
| 5,606,487 | * | 2/1997 | Yasukawa et al. ................ 361/707 |
| 5,625,536 | * | 4/1997 | Soyano et al. .................... 361/736 |
| 5,747,876 | * | 5/1998 | Majumdar et al. ................ 257/687 |

* cited by examiner

*Primary Examiner*—Leo P. Picard
*Assistant Examiner*—Boris L. Chervinsky
(74) *Attorney, Agent, or Firm*—Ostrolenk, Faber, Gerb & Soffen, LLP

(57) ABSTRACT

A power semiconductor device module has a plurality of spaced thermally supported substrates mounted within coplanar openings in an insulation support shall and electrically insulated from one another by the body of the insulation support shell. Each of the substrates may be a separate metal heatsink or a separate IMS sheet. Each of the substrates may receive one or more semiconductor die. A printed circuit board containing control circuits for the die is mounted above the plane of the substrate and contains openings in registry with each substrate for wire bonding the control circuits to the die. The structure permits the reduction in area of any IMS substrate or permits the elimination of the IMS.

13 Claims, 9 Drawing Sheets

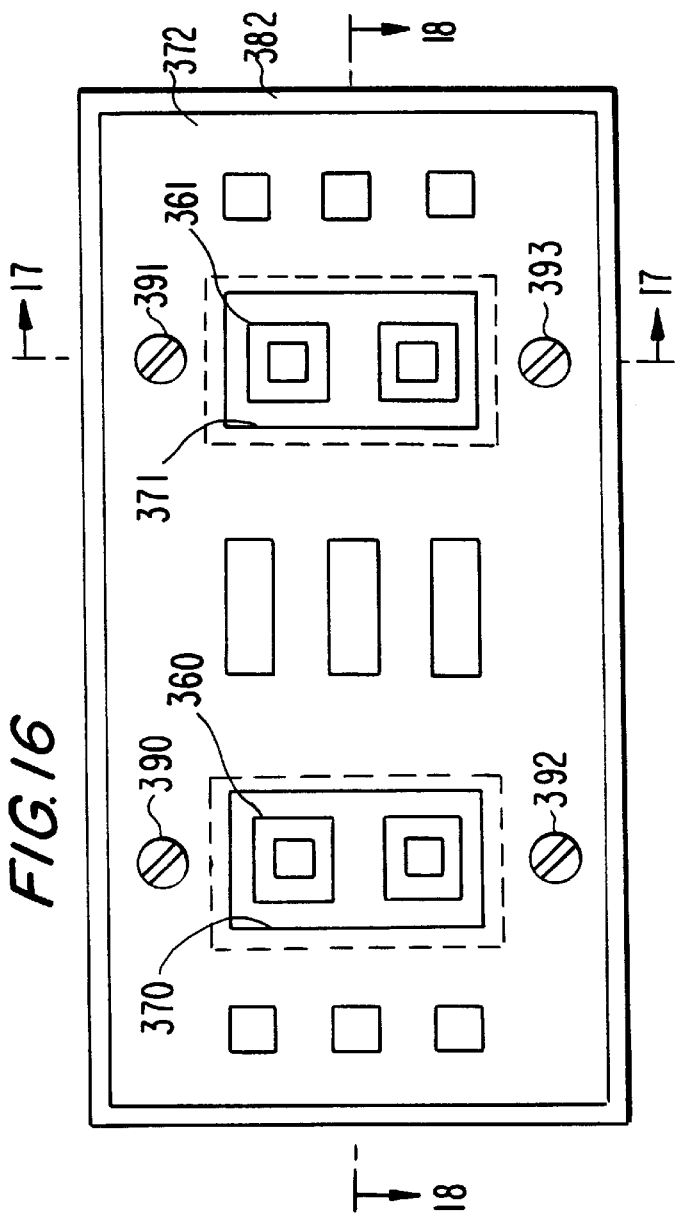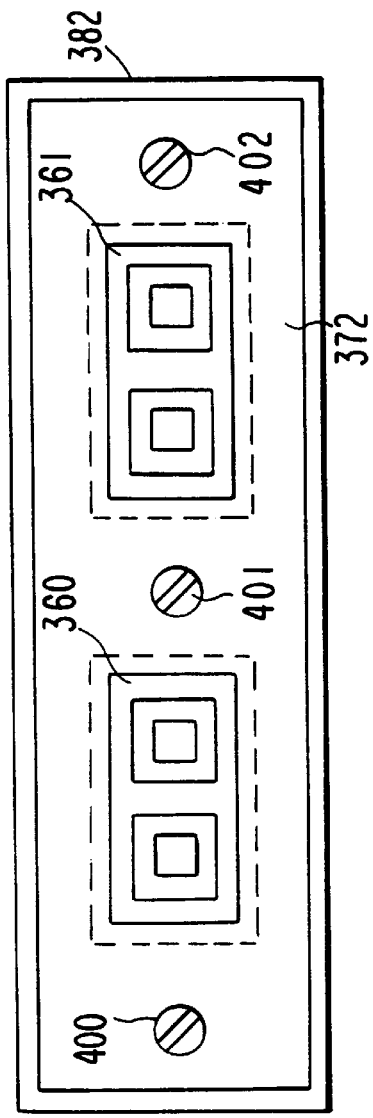

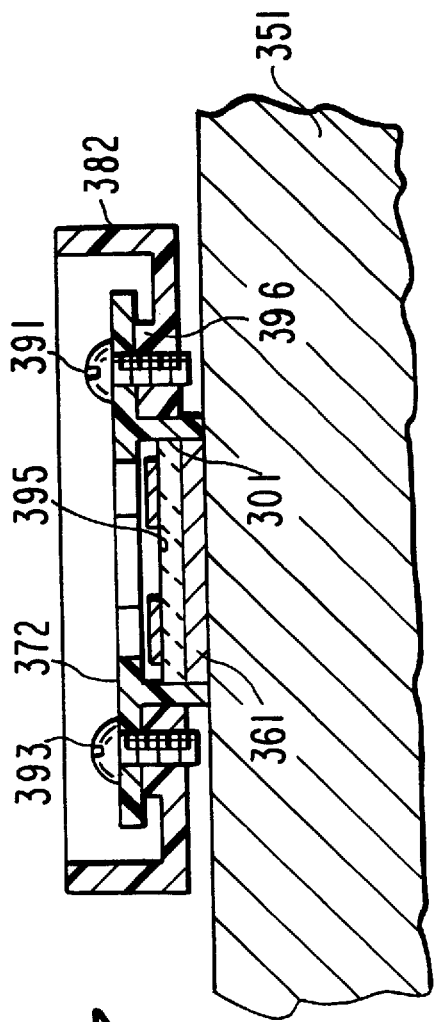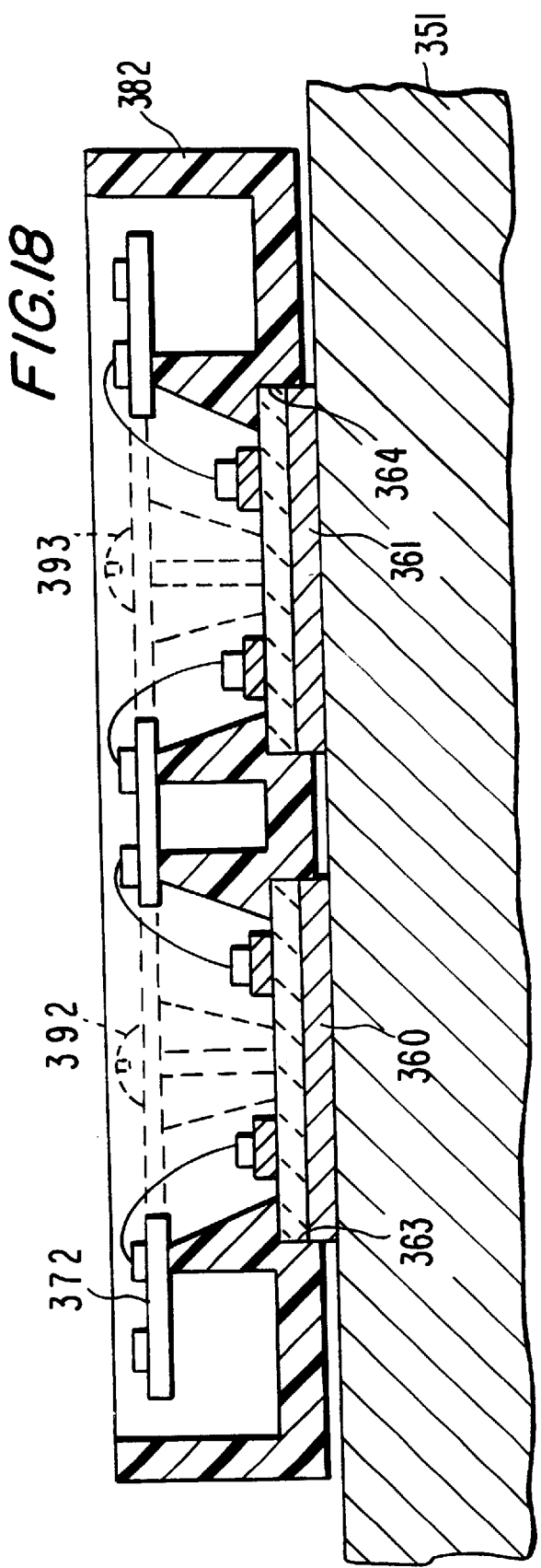

POWER SEMICONDUCTOR MODULE WITH INSULATION SHELL SUPPORT FOR PLURAL SEPARATE SUBSTRATES

RELATED APPLICATIONS

This application is based on and claims priority to U.S. Provisional Patent Application No. 60/146,678, filed Aug. 2, 1999; and U.S. Provisional Patent Application No. 60/146,891, filed Aug. 2, 1999, the entire disclosure of each is hereby incorporated by reference.

This application is a division of application Ser. No. 09/197,078 filed Nov. 20 1998 which claims benefit to U.S. provisional application Ser. No. 60/066,452, filed Nov. 24, 1997. Now 6,147,869 entitled ADAPTABLE PLANAR MODULE (IR-1520); the disclosure of which is incorporated herein by reference.

FIELD OF THE INVENTION

This invention relates to semiconductor device power modules and more specifically relates to a novel structure for such devices which simplifies their manufacturing cost and reliability.

BACKGROUND OF THE INVENTION

Semiconductor modules are well known, in which a plurality of power semiconductor die are fixed to a ceramic based substrate support such as an insulation metal substrate (IMS) or the like to interconnect the devices and are carried in a main support shell which also supports a printed circuit board (PCB) which carries control circuits for controlling the power die. Power terminals extend from the IMS for connection to a load, such as a motor and the PCB carries a terminal connector for connection to an external source of control signals. Such devices, as shown in aforementioned application Ser. No. 09/197,078 are usually arranged so that the IMS is secured within a small opening in the shell (so that the area of the expensive IMS can be minimized) and the bottom surface of the IMS can be pressed into contact with the top flat surface of a heatsink.

The PCB is generally supported in a plane above the plane of the IMS and is laterally removed from the IMS area. The bottom of the PCB is spaced above the top surface of the support shell so that components can be mounted on the bottom surface of the PCB as well as on its top surface.

In general ceramic based substrates are frequently employed to carry the various semiconductor die. These substrates usually have the construction shown in FIGS. 13 and 14 for substrate 320 and have a bottom copper layer 321, a central insulation ceramic 322, which may be $Al_2O_3$ or AlN, and a top copper layer which has been patterned into various areas, such as the six insulated areas 323, 324, 325, 326, 327 and 328 shown. Any other pattern could be formed for the top copper layer. Each of areas 323 to 328 have a respective power semiconductor device die 330 to 335 secured thereto, as by soldering or conductive epoxy, or the like. The bottom electrodes of die 330 to 335 are insulated, but could be connected together as desired by conductive traces or by wire bonds. Substrate 320 of FIGS. 13 and 14 may also be a direct bonded copper (DBC) substrate.

In order to insure the mechanical integrity of such substrates, and to prevent the ceramic from cracking, their length is usually limited to less than about 2 inches. Thus, when a power module requires a larger substrate, two or more shorter separate substrates must be used. Thus, as shown in FIG. 15, two identical substrates 320 and 340 are attached to a common base plate 341 which is of copper or of AlSiC for higher performance applications.

Substrates 320 and 340 are conventionally attached to a common baseplate 341 by solder reflow techniques, or by a conductive epoxy. The subassembly of substrates 320, 340 and base plate 341 is then secured within a plastic support shell 350 with the base plate 341 bottom exposed for connection to a flat heatsink 351. A suitable printed current board and terminals are then provided, for example as described in copending application Ser. No. 09/197,078 (IR-1520). The silicon die and substrate are wire bonded or otherwise connected to the PCB and terminal and the substrates are enclosed in a suitable potted volume.

The above described structure has a number of drawbacks. These include:

1. Tooling and material cost for base plate 341.
2. The additional processing required for the use of base plate 341.
3. The added thermal resistance between the silicon die and the heatsink 351 due to the added interfaces at the top and bottom of plate 341.
4. Degradation of power and temperature cycling capability due to the added interfaces.

It would be desirable to employ multiple substrates in a power module without the disadvantages brought about by the added common base plate.

In the known prior art structure and as described above, the entire module is attached to a single unitary heatsink as by screws or the like. The individual devices are electrically isolated from one another against conduction through the common heatsink by the use of the expensive IMS or DBC. The use of the IMS or DBC or the like substrate increases the thermal resistance between the die and heatsink.

It would be desirable to provide a power module which is a self contained circuit, as for a motor control circuit, and which does not require expensive single or multiple insulation substrate(s) and which does not impede heat flow from the die to the heatsink.

BRIEF DESCRIPTION OF THE INVENTION

In accordance with a first aspect of the present invention, multiple substrates are mounted in respective openings in a plastic shell, and the intermediate common conductive base is eliminated. A PCB is disposed above the substrates and contains openings to provide access to the tops of each substrate for the necessary interconnect and wire bonding between the silicon die, the substrates and the PCB and terminals.

If desired, the PCB may include additional interconnects such as solderable or snap mount pins, terminals, connectors, etc. for connecting another PCB, or other components or wires to other equipment.

In another implementation, the PCB can be eliminated and the insulation shell can contain an insert molded lead frame with wire bond connections being made to the lead frame. The leads may be soldered to a PCB external of the module for making the interconnects.

In still another implementation of the invention, the internal PCB may be replaced by an external PCB and the substrate may contain terminal pins (connected to the substrate by reflowed solder), which pins are connected to the external PCB.

In a yet further implementation of the invention, the separate substrates can be aligned longitudinally to reduce the number of mounting screws needed to mount the PCB to the insulation support shell.

In accordance with second aspect of the invention the single heatsink of the prior art is divided into a plurality of separate heatsinks which are fixed to the main support insulation shell of the module and are spaced from one another and are insulated from one another by the insulation shell. The die may be attached to their respective heatsinks by solder reflow or conductive epoxy techniques or the like. Thus, one or more die, the bottom electrodes of which are at the same potential, are fixed directly to the top bare conductive surface of the respective heatsinks. Thus, no IMS is needed for the isolation of die at different potentials and the die are intimately thermally connected to their respective heatsink. Note that any mixture of power die such as diodes, Power MOSFETs, IGBTs, thyristors and the like can be used.

BRIEF DESCRIPTION OF THE DRAWINGS

FIG. 16 is a top view of the PCB and substrate assembly made in accordance with the invention.

FIG. 17 is a cross-sectional view of FIG. 16 taken across section line 17—17 in FIG. 16.

FIG. 18 is a cross-sectional view of FIG. 16 taken across section line 18—18 in FIG. 16.

FIG. 19 is a view like FIG. 16 of another embodiment of the invention.

DETAILED DESCRIPTION OF THE INVENTION

Figure 1:
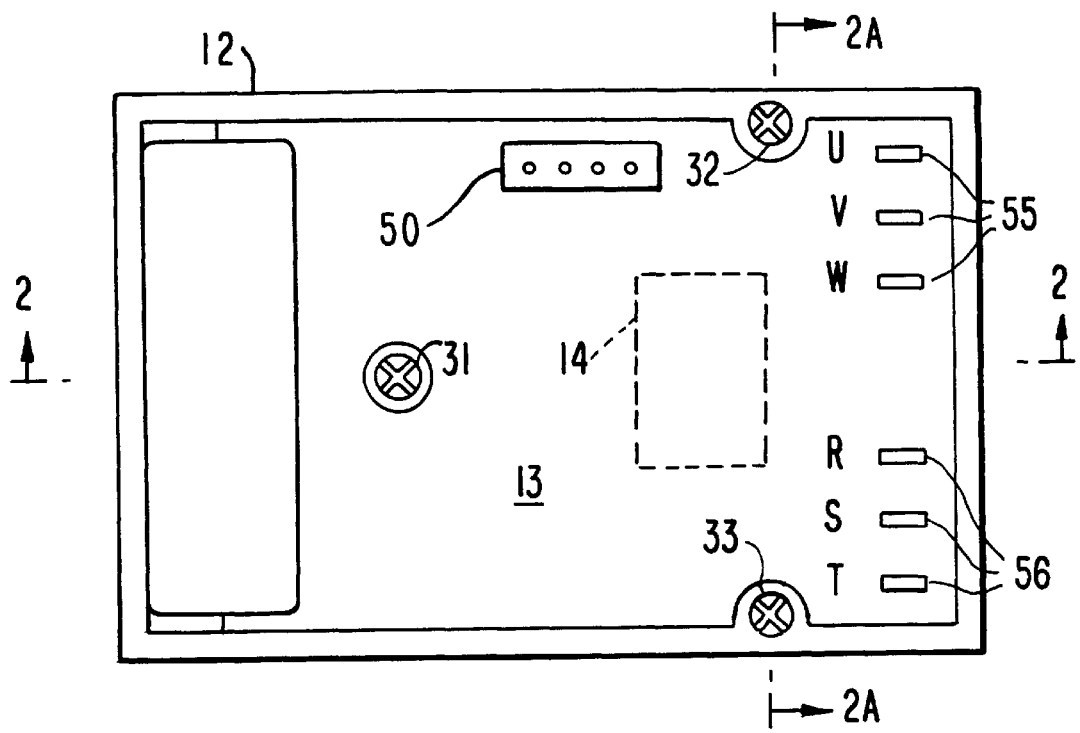
FIG. 1 is a top view of a prior art module employing an IMS substrate for mounting power semiconductor die.
Figure 2:
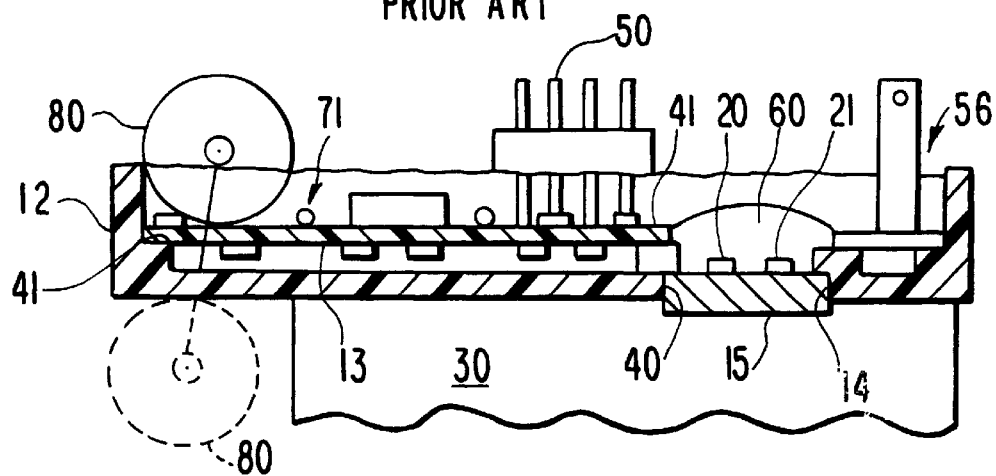
FIG. 2 is a cross-section of FIG. 1 taken across section 2—2 in FIG. 1.

Referring first to FIGS. 1 and 2 there is shown a typical prior art module, such as that of application Ser. No. 09/197,078, previously referred to, and the subject matter of which is incorporated by reference. Thus, a molded shell support base 12 supports a PCB 13 and has a bottom opening 14 in which an IMS 15 (FIG. 2) is mounted. The IMS is a flat sheet of material in which upper and lower conductive layers are insulated by a central insulation film. The conductive layers can include a lower thick copper or aluminum heatsink and a thin upper copper layer which can be patterned to form conductive mounting pads to which power die, such as die 20 and 21 can be mounted and interconnected. The die attach can be obtained by solder reflow or conductive epoxy or the like.

Figure 2A:
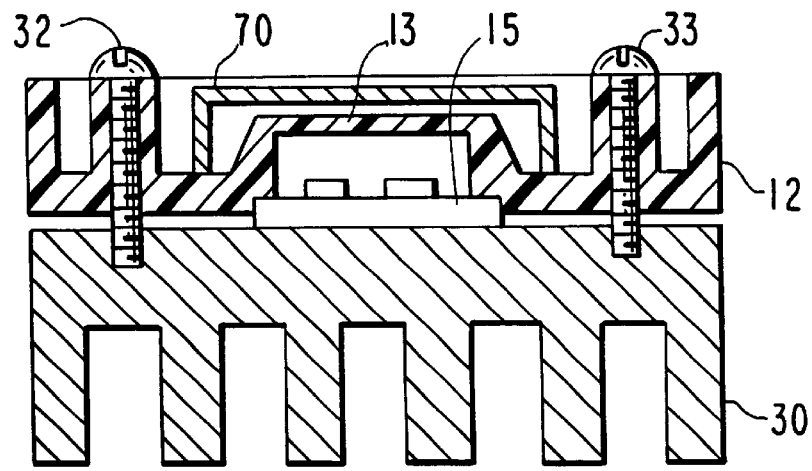
FIG. 2A is a cross section of FIG. 1 taken across section line 2A—2A in FIG. 1.

The bottom surface of the IMS 15 is pressed into contact with the flat upper surface of a single heatsink 30 (FIG. 2) as by insulated bolts 31, 32, 33 in shell 12 (FIGS. 1 and 2A). Note that the IMS 15 is fitted into a shouldered groove 40 in opening 14 (FIG. 2). Further, printed circuit board 13 sits atop a shelf 41 in shell 12 so that space is provided for components on the bottom of shelf 41.

Wire bonds are then made from die 20 and 21 to terminals on the printed circuit board 13 which will conduct control signals from control terminal 50 which controls the operation of the power die 20 and 21. Wire bonds are also made to power output terminals 55–56.

Figure 3:
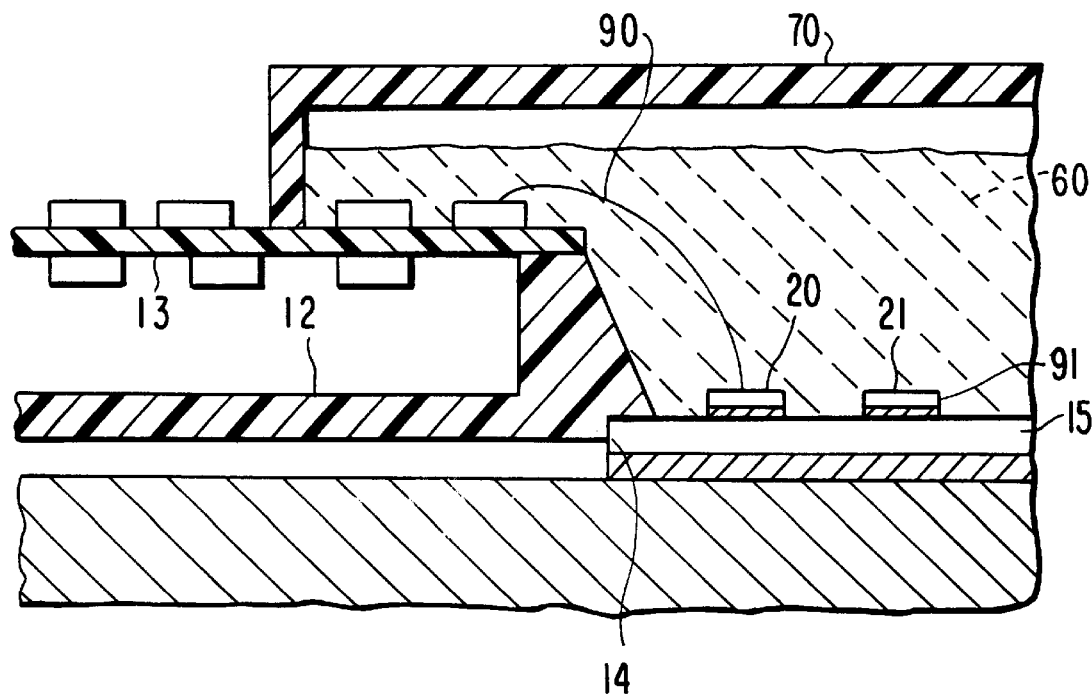
FIG. 3 is an enlarged view of FIG. 2, showing an insulation cap.

A high grade potting compound, for example a suitable flexible silastic 60 fills the cavity above the IMS 15, contained by cap 70 as shown in FIG. 3. Note that cap 70 may be first connected in place and the silastic or other potting material can be poured through openings in the cap and subsequently cured. A lower grade potting material can be used to fill the entire interior of shell 13.

A filter capacitor 80 can also be included with the module.

The structure shown in FIGS. 1 and 2 may have overall dimensions of 3.0"×2.0"×0.5" and can house a full motor control circuit, including an inverter, input circuits, protective circuits, and a microprocessor. The inverter and other power die are fastened to the IMS 15 and other components are on the PCB 13.

FIG. 3 shows an enlarged portion of the structure of FIG. 2, with a cap 70 in place to enclose silastic 60. It will be understood that the wirebond surface of IMS 15 and PCB 13 are at different heights. As a consequence of this, a large volume of encapsulant is necessary to cover the IMS 15 surface and the wires 90 and 91 (FIG. 3), which are to be wirebonded from IMS 15 to PCB 13 or the terminal pad of terminals 55 and 56 (FIGS. 1 and 2). Further, the wirebonds are long and relatively difficult to manage.

It is possible, in FIG. 2, to substantially lower the plane of PCB 13. However, this makes it impossible to place components on the underside of PCB 13, thus requiring a larger area for the PCB 13 if a large number of components is needed. Further, the PCB 13 is also brought closer to the heatsink 30, making the PCB 13 run hotter.

Figure 4:
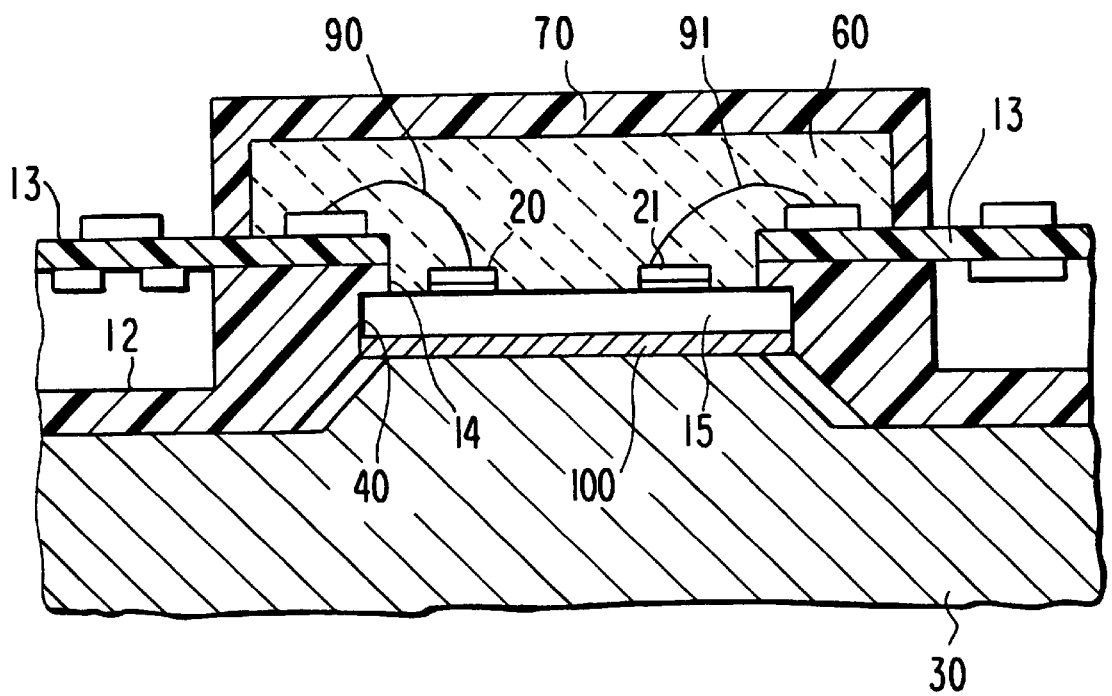
FIG. 4 is a view similar to FIG. 2 of a modified structure for the device of FIGS. 1 to 3.
Figure 5:
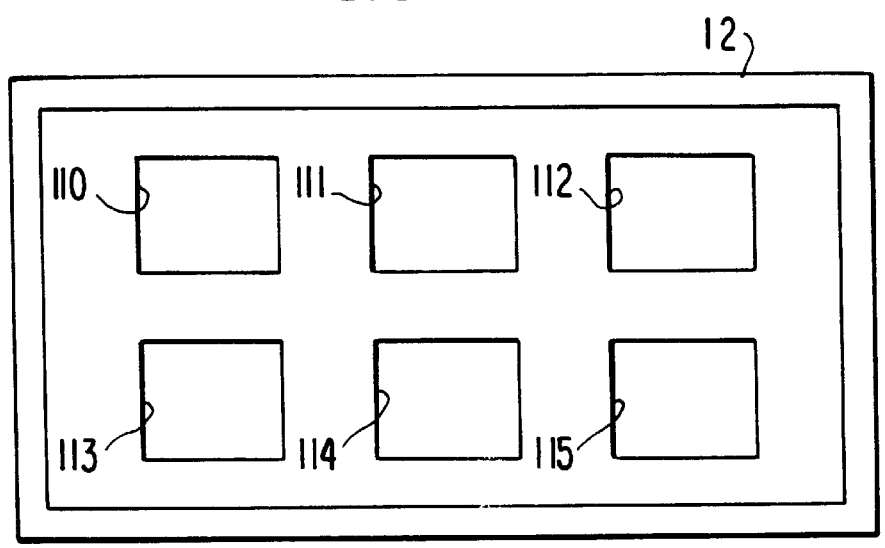
FIG. 5 is a top view of the shell structure of FIGS. 1 to 4 modified in accordance with the invention.
Figure 9:
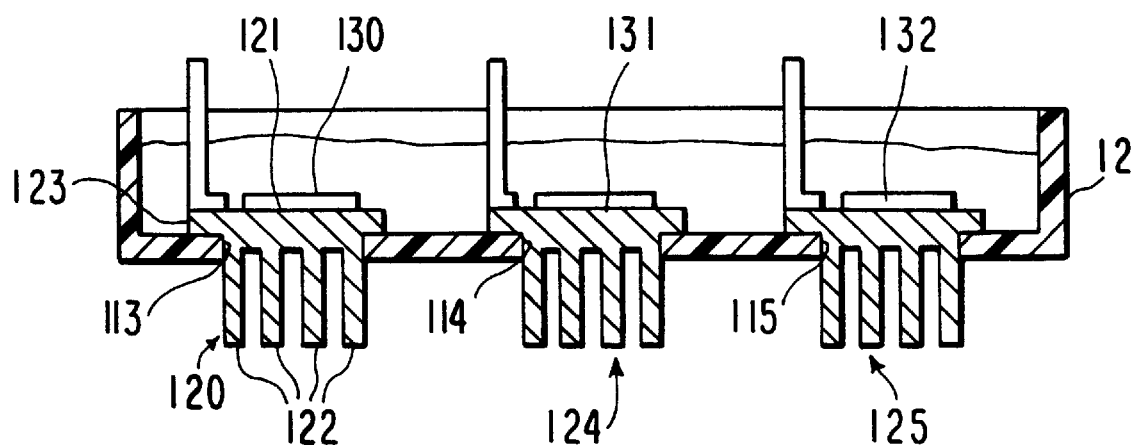
FIG. 9 is a cross-section of FIG. 8 taken across section line 9—9 in FIG. 8.
Figure 6:
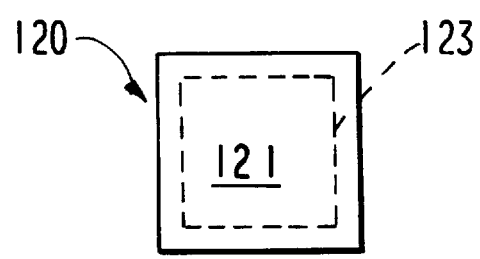
FIG. 6 is a top view of one of the isolated heatsinks which is to be mounted in the main insulation shell.
Figure 7:
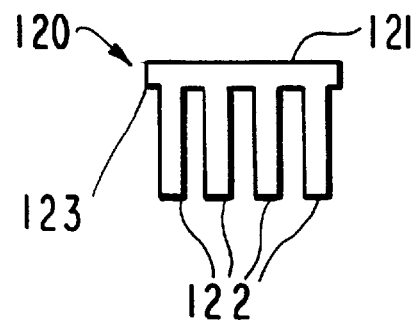
FIG. 7 is a side view of the heatsink of FIG. 6.
Figure 8:
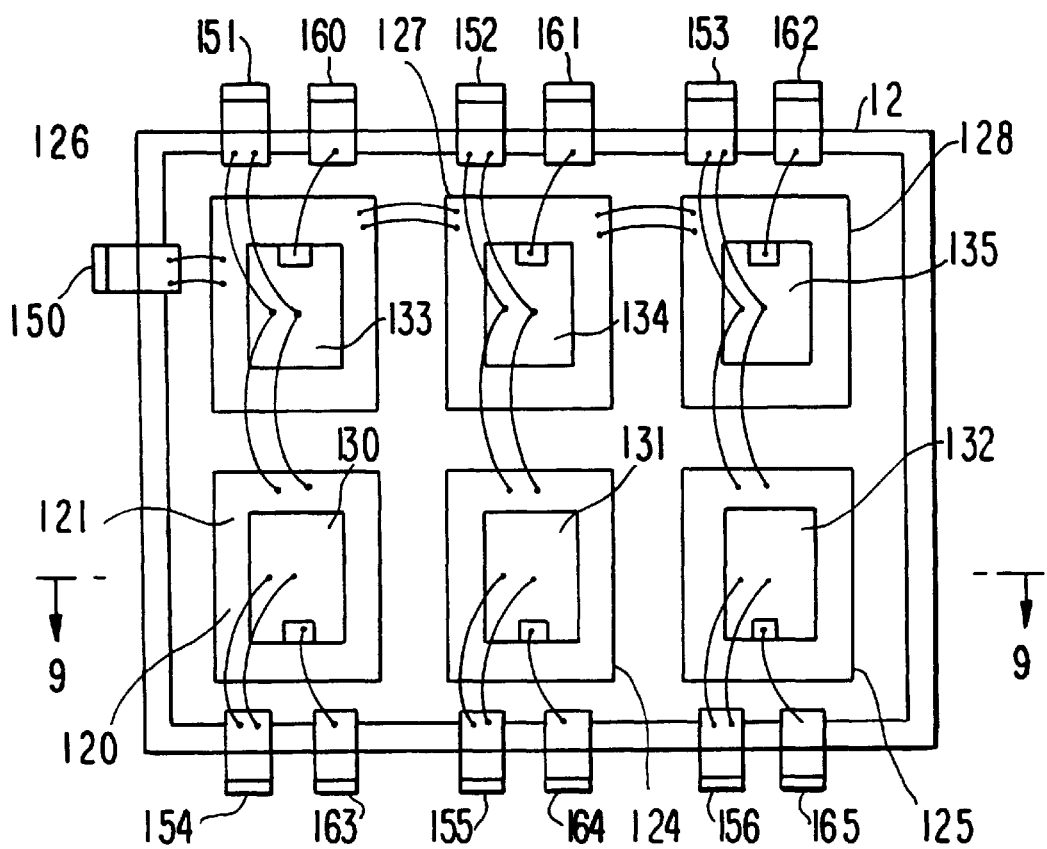
FIG. 8 is a top view of the insulation shell of FIG. 5 with the separate heatsinks cemented in place.

As shown in FIG. 4, the structure of insulation shell 12 may be modified so that shoulder 40 is moved up much higher toward the plane of PCB 13. The bottom of IMS 15 is then brought substantially above the plane of the bottom of shell 12. Therefore, a mesa 100 with a flat upper surface is formed on heatsink 30 and is arranged to press against the bottom surface of IMS 15, which is confined in shoulder 40 which surrounds opening 14.

The resulting structure brings the upper surface of the die 20 and 21 closer to the plane of PCB 13 which surrounds IMS 15, as shown in FIG. 4. Consequently, the volume above IMS 15, which must be filled with high grade and, thus, expensive silastic 60 is considerably reduced; the length of wire bonds 90 and 91 is shortened, reducing mechanical stress on the wire bonds during operation; and the wire bondability and quality is improved, improving production yield.

Referring next to FIGS. 5 to 9, where components similar to those of FIGS. 1 to 4 have the same reference numerals, the main support shell 12 is modified, as shown in 5 to have a plurality of openings 110, 111, 112, 113, 114 and 115 which are sized to receive respective heatsinks which are to be insulated from one another.

FIGS. 6 to 9 show one of the heatsinks 120 which is mounted in opening 113. Heatsink 120 has a flat die-receiving upper surface 121, a finned body 122 and an outer flange 123. The body of heatsink 120, and of identical heatsinks 124, 125, 126, 127 and 128 (FIGS. 8 and 9) are fitted into openings 113, 114, 115, 110, 111 and 112, respectively. They are secured to shell 12 in any desired way, as by cementing to the underside of flanges such as flange 123 of heatsink 120. Obviously the heatsinks are insulated from one another by the insulation material of shell 12.

Before or after the installation of heatsinks 120 and 124 to 128, individual power semiconductor die 134 such as die 130, 131, 132, 133, 134 and 135 (FIGS. 8 and 9) are connected to the top surfaces such as surface 121 of each of heatsinks 120 and 124 to 128, respectively. The die are power die having bottom electrodes which may be thermally and electrically coupled directly to their respective heatsink. The top electrodes of die 130 to 135 are then electrically connected to form any desired circuit by wire bonds which interconnect the die and are connected to external leads. These external leads or terminals are shown as terminal 150 which is connected to each of heatsinks 126, 127 and 128 (and thus to the bottom electrodes of die 133, 134 and 135); terminals 151, 152 and 153 which are wire bonded to the top contacts of die 133, 134 and 135 respectively, and to heatsinks 120, 124 and 125, respectively; terminals 154, 155 and 156 which are connected to the top metal electrodes of die 130, 131 and 132, respectively; and control terminals 160, 161, 162, 163, 164 and 165 which are connected to the gate, or control electrodes of the 133 to 135 and 130 to 132, respectively. Note that terminals 150 through 165 can be elements of a common lead frame.

It is to be noted that the control printed circuit board such as board 13 of FIGS. 1 to 4 may be fixed within the shell 12 in FIGS. 5 to 9, above the level of die 130 to 135 to provide or process the control signals applied to control terminals 160 to 165.

The present invention, as shown in FIGS. 5 to 9, eliminates the need for an expensive IMS substrate to appropriately insulate various ones of the die 130 to 135 by employing separate heatsinks; and improved thermal performance is also obtained.

Figure 10:
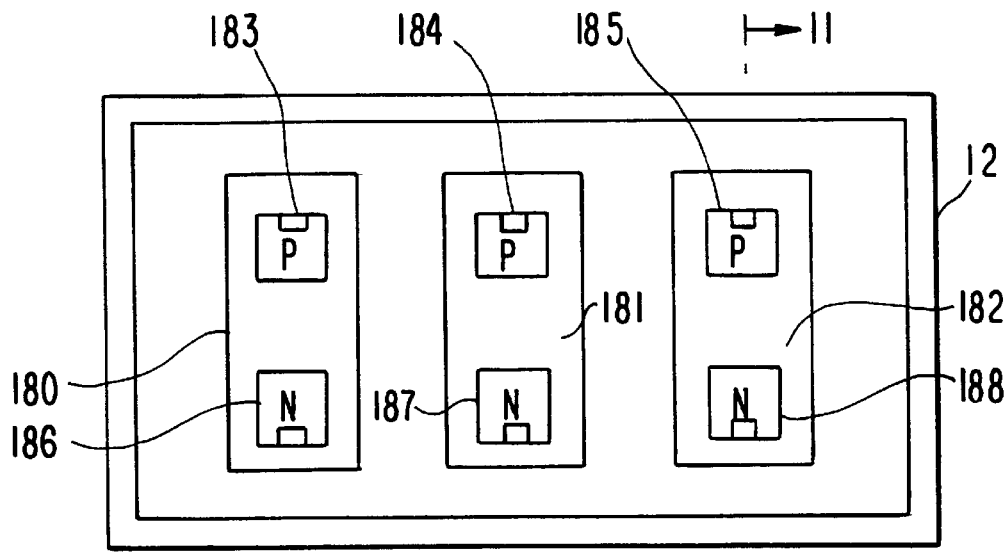
FIG. 10 is a top view of a second embodiment of the invention in which three heatsinks each receive a P channel and an N channel MOSFET which have bottom electrodes at the same potential.
Figure 11:
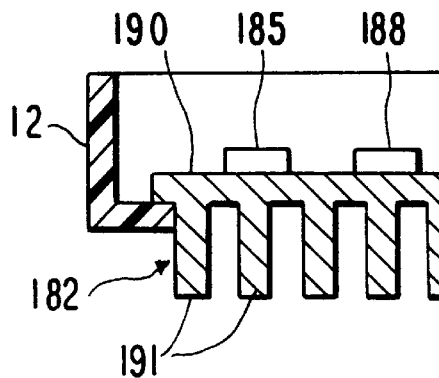
FIG. 11 is a schematic cross-section of FIG. 10 taken across section line 11—11 in FIG. 10.

While the structure in the embodiment of FIGS. 5 to 9 shows a separate heatsink for a respective die, it will be understood that more than one die can be mounted on singulated heatsinks. For example, FIGS. 10 and 11 show an embodiment employing three heatsinks 180, 181 and 182. Each of the heatsinks carry a P channel MOSFET 183, 184 and 185, respectively and an N channel MOSFET 186, 187 and 188, respectively. Each of heatsinks 180 to 182 have a flat top surface for receiving the two spaced die, a flange (flange 190 in FIG. 11) which can be cemented into an opening in insulation shell 12 and fins 191 or any other desired structure. The structure and circuit can be completed in any desired manner.

Figure 12:
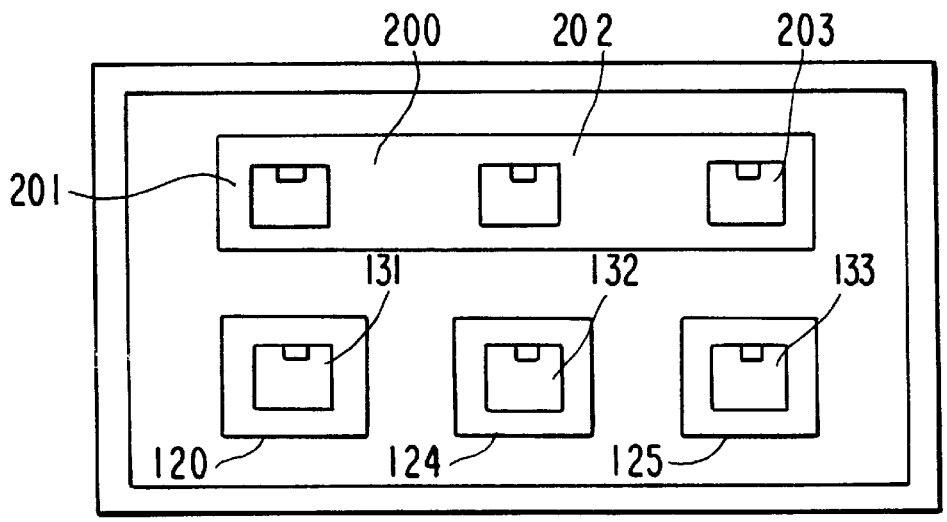
FIG. 12 is a top view of a further embodiment of the invention.
Figure 14:
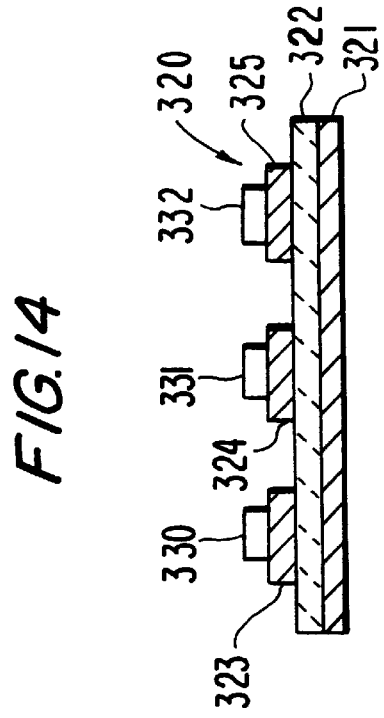
FIG. 14 is a cross-sectional view of FIG. 1 taken across section line 14—14 in FIG. 13.
Figure 13:
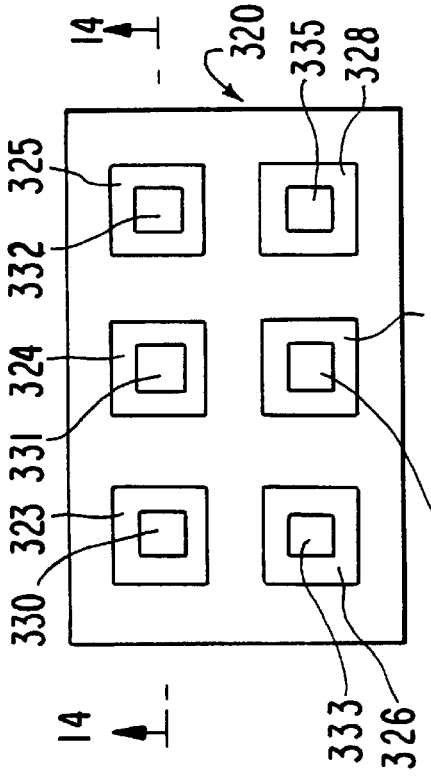
FIG. 13 is a top view of a conventional insulation ceramic.

It is also possible to mix different sized heatsinks, as shown in FIG. 12. Thus, as shown in FIG. 12, one long heatsink 200 can carry spaced, interconnected (at their bottom electrodes) MOSFETs 201, 202 and 203 while separate heatsinks such as heatsinks 120, 124 and 125 of FIGS. 8 and 9 can carry fully electrically isolated power MOSFETs 130, 131 and 132, respectively.

Figure 15:
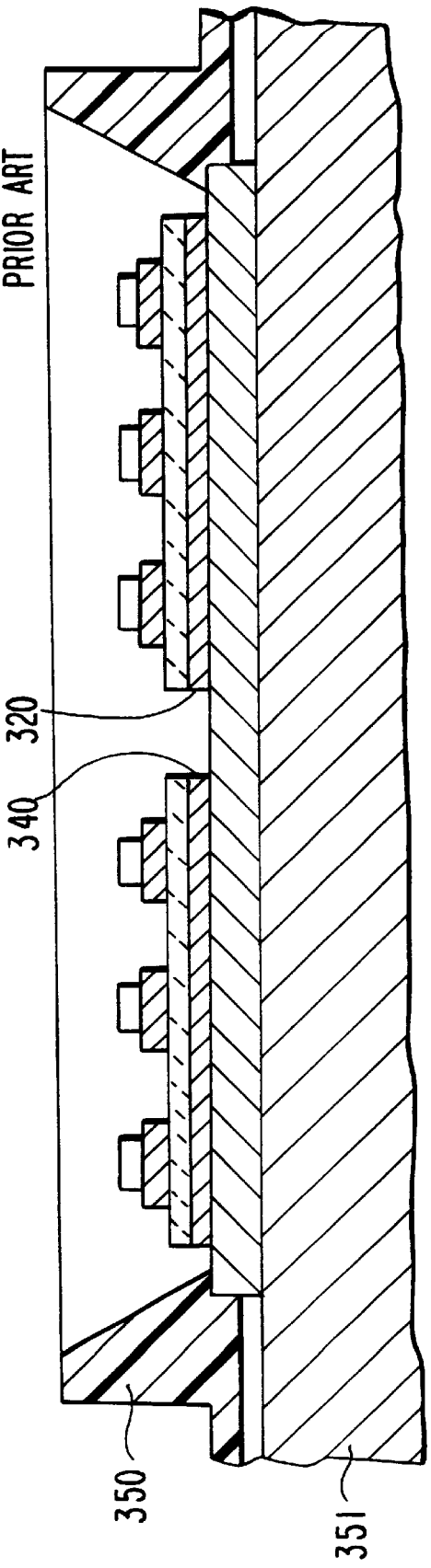
FIG. 15 shows in cross-section, the manner in which several substrates are mounted in an insulation shell.

Referring next to FIGS. 16, 17 and 18 there is shown a further embodiment of another aspect of the invention. Thus, two separate substrates 360 and 361, which are similar to substrates 320 and 340 respectively, are separately pressed against the heatsink by mounting screws in the insulation support housing 382 (similar to housing 350 in FIG. 15). The substrates 360 and 361 are contained within separate openings 363 and 364 respectively (FIGS. 17 and 18), and their top surfaces are exposed through openings 370 and 371 in the PCB 372. PCB 372 is mounted within the housing 382 and is secured thereto by screws 390, 391, 392 and 393 which thread into bosses extending integrally from housing 382. Bosses 395 and 396 are shown in FIG. 17 for screws 391 and 393 respectively.

After the assembly of FIGS. 16, 17 and 18, the substrate, silicon die, PCB and terminals (not shown) may be wire bonded or otherwise interconnected.

FIG. 19 shows an arrangement of the substrates 360 and 361 longitudinally in line in a longer, narrower insulation shell than that of FIGS. 16, 17 and 18. This arrangement permits the use of fewer screws 400, 401 and 402 for fastening PCB 372 to the shell 382.

The foregoing description of the preferred embodiments of the present invention have been provided for the purposes of illustration and description. It is not intended to be exhaustive or to limit the invention to the precise forms disclosed. Many modifications and variations are possible in light of the above teaching. It is intended that the scope of the invention not be limited to this detailed description, but rather by the claims appended hereto.

What is claimed is:

1. A power module comprising, in combination, a plurality of power semiconductor die each having a bottom surface and a top surface; an insulation support shell; a plurality of thermally conductive semiconductor die support means for receiving the bottom surfaces of respective ones of said power semiconductor die; and a printed circuit board containing a control circuit thereon for controlling the operation of said plurality of power die; said printed circuit board disposed in a plane and parallel to the plane of said die support means; said printed circuit board having a plurality of spaced openings therein; said insulation support shell having a plurality of coplanar openings therein which are each centered on a respective one of the openings in said printed circuit board; said plurality of thermally conductive support means being disposed and fixed within respective ones of said openings in said insulation shell and being electrically insulated from one another by said insulation shell; and wire bond means extending through said openings and connecting said control circuits to respective ones of said power semiconductor die.

2. The power module of claim 1, wherein said plurality of thermally conductive support means are each an electrically conductive heatsink; and wherein at least one of said plurality of semiconductive die is affixed to the upper surface of respective ones of said heatsinks.

3. The power module of claim 1, wherein each said plurality of thermally conductive support means comprises an electrical insulation substrate having a conductive upper surface region; at least one of said plurality of semiconductor die being affixed to said conductive upper surface of each of said substrates; each of said substrates being adapted to receive an electrically conductive heatsink in thermal communication with their bottom surfaces.

4. The power module of claim 1, wherein each of said thermally conductive support means has a square upper surface.

5. The power module of claim 1, wherein each of said thermally conductive support means has an elongated rectangular surface.

6. The power module of claim 2, wherein each of said thermally conductive support means has a square upper surface.

7. The power module of claim 3, wherein each of said thermally conductive support means has a square upper surface.

8. The power module of claim 2, wherein each of said thermally conductive support means has an elongated rectangular surface.

9. The power module of claim 3, wherein each of said thermally conductive support means has an elongated rectangular surface.

10. The power module of claim 1, wherein each of said support means receives at least two spaced semiconductor die on the top surface thereof; said at least two die on each of said support means being electrically connected at their bottom surfaces.

11. The power module of claim 2, wherein each of said support means receives at least two spaced semiconductor die on the top surface thereof; said at least two die on each of said support surfaces being electrically connected at their bottom surfaces.

12. The power module of claim 3, wherein each of said support means receives at least two spaced semiconductor die on the top surface thereof; said at least two die on each of said support surfaces being electrically connected at their bottom surfaces.

13. The power module of claim 5, wherein each of said support means receives at least two spaced semiconductor die on the top surface thereof; said at least two die on each of said support surfaces being electrically connected at their bottom surfaces.

* * * * *

UNITED STATES PATENT AND TRADEMARK OFFICE
CERTIFICATE OF CORRECTION

PATENT NO. : 6,272,015 B1
DATED : August 7, 2001
INVENTOR(S) : Vijay Mangtani

It is certified that error appears in the above-identified patent and that said Letters Patent is hereby corrected as shown below:

<u>Title page,</u>
Please insert: --
[62] This application is related to application serial No. 09/197,078, filed on November 20, 1998, now Patent No. 6,147,869.

[60] Provisional application No. 60/146,678, filed on August 2, 1999, and provisional application No. 60/146,891, filed on August 2, 1999. --

Signed and Sealed this

Sixteenth Day of April, 2002

*Attest:*

JAMES E. ROGAN
*Attesting Officer*     *Director of the United States Patent and Trademark Office*